United States Patent
Kang et al.

(10) Patent No.: US 11,484,993 B2
(45) Date of Patent: Nov. 1, 2022

(54) SUBSTRATE HOLDING APPARATUS AND METHOD FOR SHAPE METROLOGY

(71) Applicant: Tokyo Electron Limited, Tokyo (JP)

(72) Inventors: Hoyoung Kang, Albany, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/572,188

(22) Filed: Jan. 10, 2022

(65) Prior Publication Data

US 2022/0143786 A1 May 12, 2022

Related U.S. Application Data

(62) Division of application No. 16/357,543, filed on Mar. 19, 2019, now Pat. No. 11,247,309.

(60) Provisional application No. 62/645,128, filed on Mar. 19, 2018.

(51) Int. Cl.
*B25B 11/00* (2006.01)
*H01L 21/687* (2006.01)
*H01L 21/683* (2006.01)

(52) U.S. Cl.
CPC ........ *B25B 11/005* (2013.01); *H01L 21/6838* (2013.01); *H01L 21/68735* (2013.01); *H01L 21/68785* (2013.01)

(58) Field of Classification Search
CPC .......... H01L 21/6838; H01L 21/68735; H01L 21/68785; B25B 11/005
See application file for complete search history.

(56) References Cited

U.S. PATENT DOCUMENTS

| | | | | |
|---|---|---|---|---|
| 5,235,995 A * | 8/1993 | Bergman | .......... | H01L 21/68728 134/182 |
| 6,439,967 B2 * | 8/2002 | Carpenter | ................ | B24D 9/08 451/507 |
| 10,896,842 B2 * | 1/2021 | Yoshikawa | .......... | H01L 21/6875 |
| 2002/0050322 A1 * | 5/2002 | Kunisawa | ........... | H01L 21/6838 156/345.11 |
| 2013/0154675 A1 * | 6/2013 | Miyazaki | ................ | G01R 31/00 324/750.01 |
| 2015/0079701 A1 * | 3/2015 | Yamashita | ........ | H01L 21/68742 118/712 |

* cited by examiner

*Primary Examiner* — Seahee Hong

(57) ABSTRACT

An apparatus and method for uniformly holding a substrate without flexure or bending of the substrate, thereby enabling accurate shape measurements of the substrate such as wafer curvature, z-height values and other surface characteristics. Techniques include using a liquid as a supporting surface for a substrate thereby providing uniform support. Liquid used has a same specific gravity of a substrate being supported so that the substrate can float on the liquid without sinking. Uniform support of the substrate enables precision metrology.

14 Claims, 2 Drawing Sheets

SUBSTRATE HOLDING APPARATUS AND METHOD FOR SHAPE METROLOGY

CROSS REFERENCE TO RELATED APPLICATIONS

The present application is a Divisional application of U.S. Non-Provisional patent application Ser. No. 16/357,543, filed on Mar. 19, 2019, which claims benefit of U.S. Provisional Patent Application No. 62/645,128 filed on Mar. 19, 2018, the entire contents of which are herein incorporated by reference.

BACKGROUND OF THE INVENTION

This relates to holding substrates such as wafers for various processing and metrology techniques.

Processing of semiconductor wafers includes many different steps. These can include, coating a wafer, exposing a wafer to a pattern of actinic radiation, etching materials, depositing materials, cleaning a wafer surface, measuring structures, electrical testing, and packaging. Each process step typically needs the wafer to be securely or sufficiently held for a given process.

SUMMARY

During semiconductor fabrication, it is common for various measurements of wafers to be executed to improve microfabrication and implement process control. Conventional metrology techniques include measuring characteristics of a substrate such as critical dimension (CD) deviations, film thickness, artifact deposits, et cetera. Emerging metrology and process control techniques include correcting wafer bow or curvature. Accurately measuring curvatures on the nanometer scale, however, is challenging because conventional substrate holding mechanisms induce or enable a degree of curvature.

Techniques herein provide an apparatus and method for uniformly holding a substrate without bowing so that shape measurements such as wafer curvature, z-height values and other surface characteristics can be accurately measured. Techniques include using a liquid as a supporting surface for a substrate thereby providing uniform support. Conventional substrate supports use a vacuum chuck or edge supports. While such supports can be adequate for some processing such as cleaning and etching, such supports permit gravitational bending of a given substrate making shape measurement difficult. By selecting a liquid having a same specific gravity as that of a given substrate being supported, the given substrate can float on the liquid without sinking. Such a holding mechanism herein improves metrology precision.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
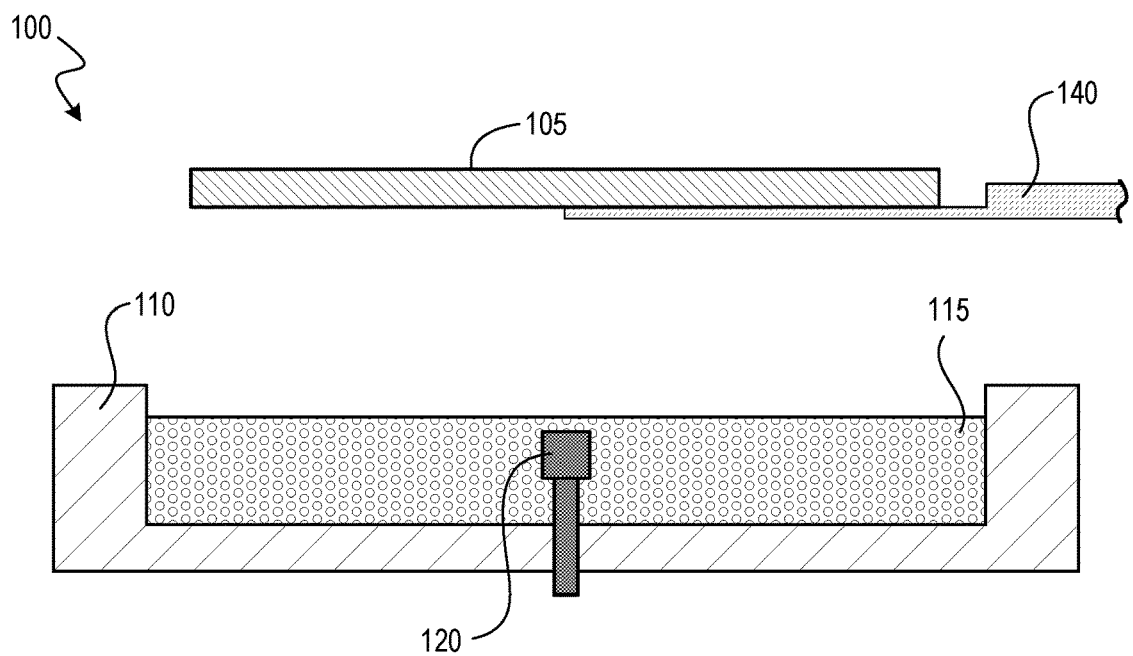
FIG. 1 is a cross-sectional view of a substrate holding apparatus prior to receiving a substrate according to embodiments disclosed herein.

Techniques herein provide an apparatus and method for uniformly holding a substrate without bowing of the substrate so that shape measurements such as wafer curvature, z-height values and other surface characteristics can be accurately measured. Techniques include using a liquid as a supporting surface for a substrate. The liquid provides uniform support.

Conventional substrate supports typically use a vacuum chuck or edge supports. While such supports can be adequate for some processing such as cleaning and etching, these conventional supports enable gravitational bending of a given substrate making shape measurement difficult. For example, if a substrate (such as a circular wafer) is supported by a relatively small vacuum chuck, then the pull of gravity can cause bending. For example, a given vacuum chuck may attach to a center portion of a backside surface of a substrate. This given vacuum chuck may contact less than about 20% of a surface area of the substrate. With center support and no edge support, the edges of the wafer can deflect due to gravity. In other words, a weight of the substrate itself can cause bending with the edges bending downwardly. In practice, such bending might not be noticeable to the human eye, but on the microscopic scale such bending can be significant when attempting to measure characteristics with values in the hundreds, tens, or even single digit nanometers.

Bending also occurs with edge-supported substrates. Once again, with the substrate being relatively thin, the weight of the substrate itself can cause bending when held at a periphery of the substrate. This time, a center portion of a substrate can deflect downwardly.

Thus, substrate bending can occur in various sizes of vacuum chucks. One option to address this issue is to use a smaller chuck or weaker holding force. Unfortunately, using a smaller chuck or weaker holding force can change a wafer shape or permit location changes from substrate motion.

Techniques herein provide uniform substrate support, with no gravitational sag, which enables precision measurements of a substrate surface. Techniques herein include using a liquid to support a given substrate. The liquid can be contained within a container or basin. Preferably a liquid is selected that matches a specific gravity of a particular substrate to be supported. Matching a specific gravity of the substrate and liquid means that the substrate can partially sink into the liquid, while still floating on the liquid. Any of various liquids can be selected. For example, a heavy oil such as dibromomethane or its derivative can be used. For supporting semiconductor substrates (wafers), such oils can have a similar specific gravity with silicon. Other example liquids can include salted water that contains zinc bromide or other additives to result in a desired specific gravity. A given liquid can be selected to have a relatively high viscosity by appropriate liquid selection or by including additives, such as glycerol, that increase viscosity. As can be appreciated, many types of liquids can be selected and various additives included to result in a liquid of a desired specific gravity.

Using a specific gravity matched liquid for support provides uniform support of a backside surface of the substrate, yet substrate motion can still occur. Measurement precision can be increased by preventing additional movement of the substrate, such as from fluid movement. Such an additional securing mechanism can include using a vacuum chuck that is relatively small to minimize wafer distortion. A given holding force can be minimized for semiconductor wafers because of their low weight. Alternative mechanisms include edge supports primarily to prevent lateral movement of a substrate while the substrate is uniformly supported by a liquid.

In some embodiments, a relatively thin membrane can be used to separate the substrate from the liquid. In such embodiments, the substrate is resting on the membrane, which in turn is resting on the liquid. The membrane can be selected to be flexible and thin so that the substrate is still supported by the liquid, and the membrane merely separates the liquid from the substrate to prevent wetting of the substrate. If the membrane is sufficiently thin and/or flexible then the substrate can partially sink into the liquid until a top surface of the substrate is at a same level as a top surface of the liquid.

Referring now to FIG. 1, one embodiment includes an apparatus 100 for holding a substrate, such as a wafer. The apparatus 100 includes a container 110 configured for holding a liquid 115. The container 110 defines a top opening such that when the container is holding the liquid, a top surface of the liquid is accessible to substrate placement on the top surface of the liquid and substrate removal from the top surface of the liquid. The container can be any type of basin or tub configured for holding a liquid. The apparatus 100 can have a top enclosure with a side opening (not shown) for placement and retrieval of a substrate. Various form factors can be created. The apparatus includes a substrate handling mechanism 140 configured to place a substrate 105 on the top surface of the liquid 115 and remove the substrate from the top surface of the liquid. Substrate handling mechanism 140 can be embodied using various handling arms and mechanisms.

Figure 2:
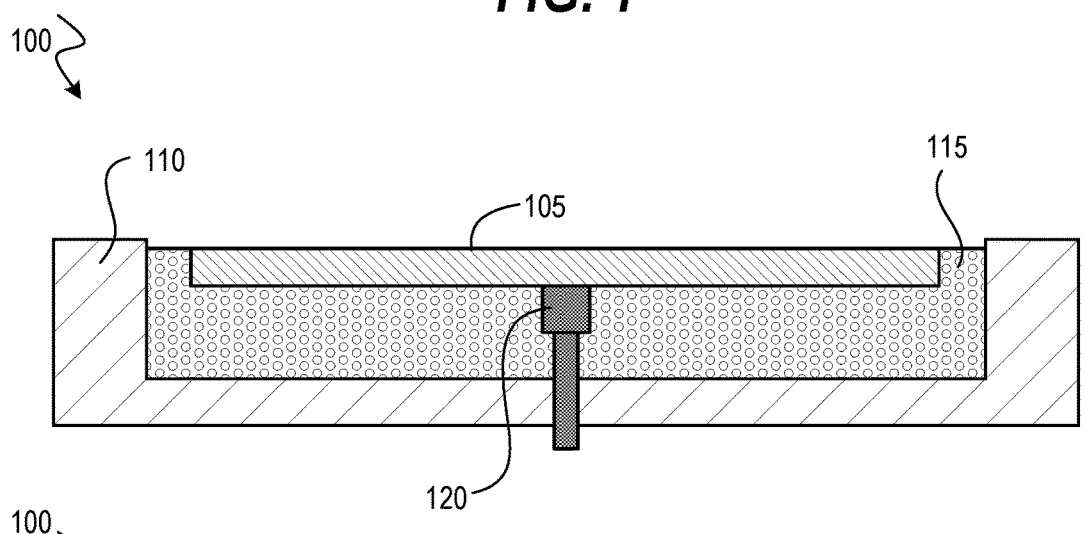
FIG. 2 is a cross-sectional view of a substrate holding apparatus holding a substrate according to embodiments disclosed herein.
Figure 3:
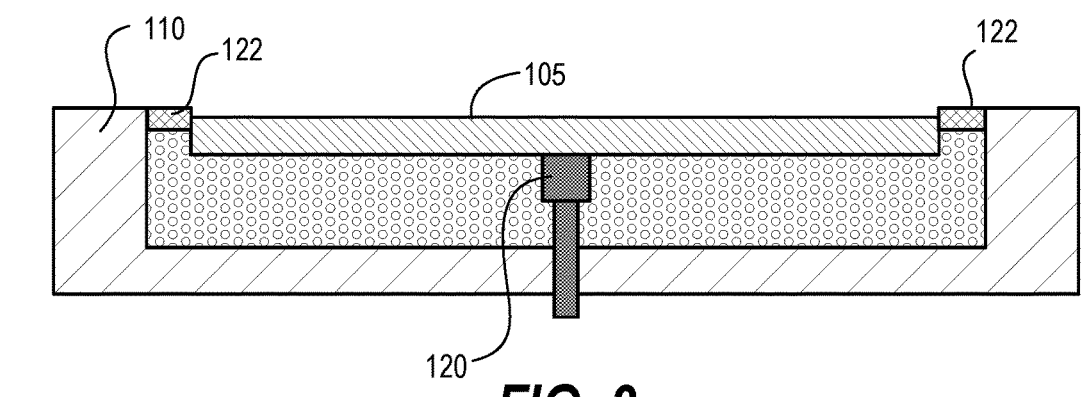
FIG. 3 is a cross-sectional view of a substrate holding apparatus holding a substrate according to embodiments disclosed herein.

Referring now to FIGS. 2 and 3, a substrate holding mechanism is configured to prevent movement of the substrate 105 when resting on the top surface of the liquid 115. Such a substrate holding mechanism can be vacuum chuck 120 and/or edge supports 122. The substrate 105 is still supported on a bottom surface of the substrate by liquid 115, but to prevent movement of the substrate across the liquid a rigid holding mechanism can be used. Such a vacuum chuck 120 can then attach to a bottom surface of the substrate. A strong chucking force is not needed typically. The vacuum chuck can contact a surface area that is relatively small such as less than ten percent or five percent of the surface area of the substrate backside. Of course larger chucking areas can be used. Substrate measuring can benefit from a relatively small chucking area so that most of the substrate is supported by the liquid for uniform support, which liquid prevents gravitational bending. An edge support 122 can be used in place of, or in addition to, a vacuum chuck to prevent lateral movement across the liquid and/or help quickly stabilize any movement of the fluid from placement.

Figure 4:
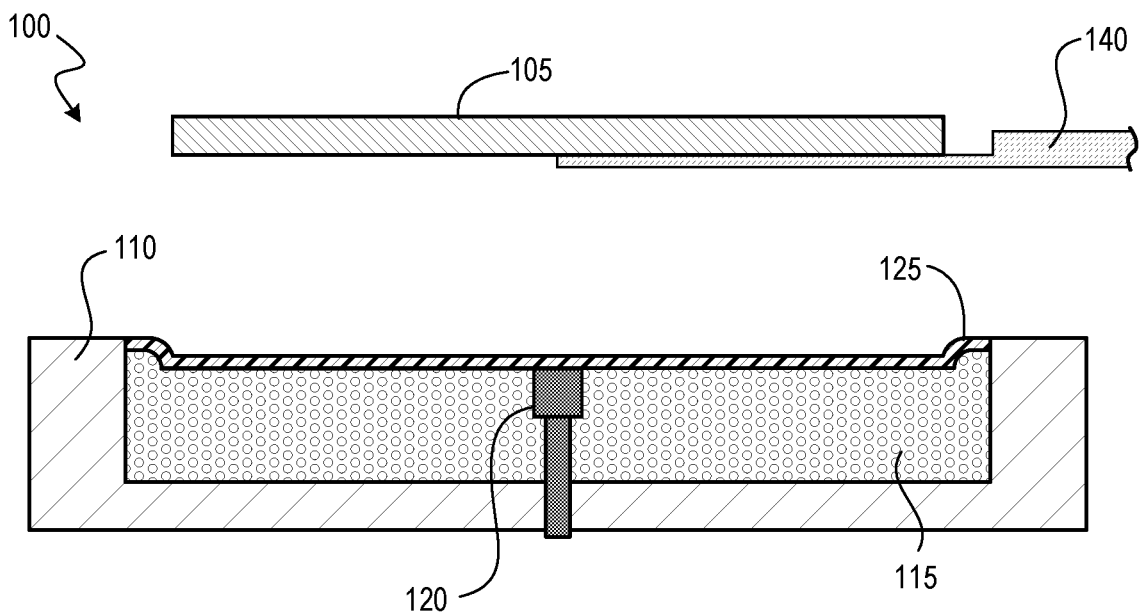
FIG. 4 is a cross-sectional view of a substrate holding apparatus prior to receiving a substrate according to embodiments disclosed herein.
Figure 5:
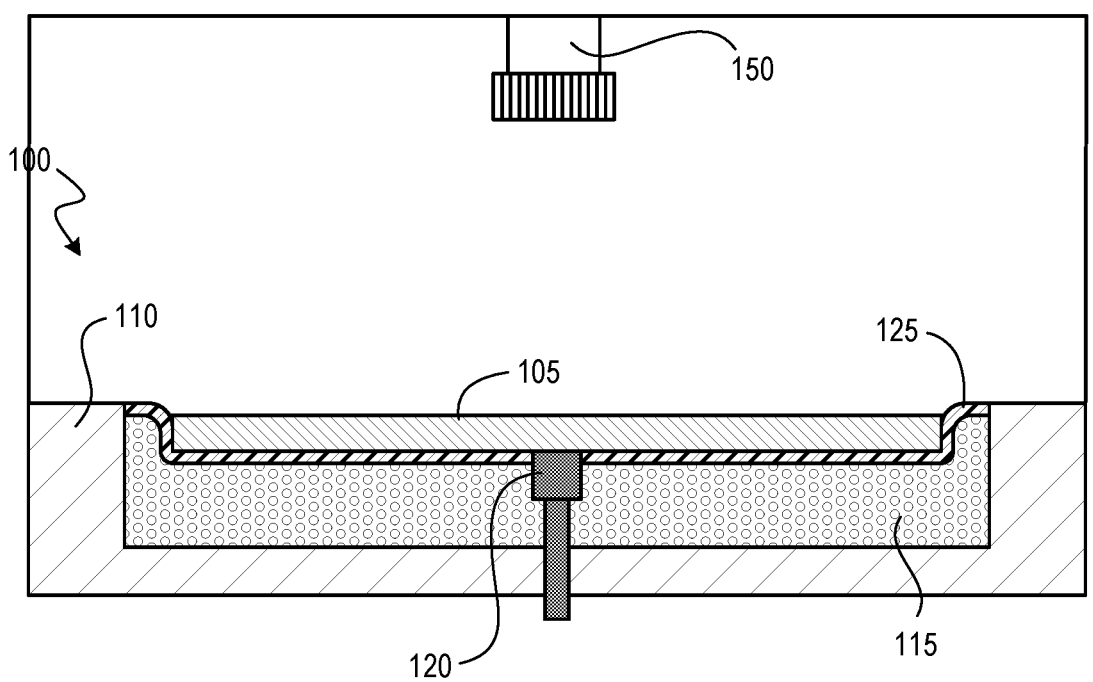
FIG. 5 is a cross-sectional view of a substrate holding apparatus holding a substrate according to embodiments disclosed herein.

Referring now to FIGS. 4 and 5, a membrane 125 can be positioned on the top surface of the liquid 115, separating the substrate 105 from the liquid. With such a membrane 125, the substrate 105 can remain dry or not oily (depending on the liquid used). The membrane 125 can have sufficient flexibility or slack to permit the wafer to partially sink into the liquid. This membrane can be flexible enough that the substrate can sink partially into the liquid, and have a top surface of the substrate and a top surface of the wafer in plane with each other or approximately level with each other. FIG. 4 shows apparatus 100 prior to placement of substrate 105 on the membrane 125, while FIG. 5 illustrates substrate support using the liquid 115 with membrane 125 separating the substrate from the liquid.

The liquid can be selected to have a specific gravity that matches a specific gravity of the substrate. In other words, a specific gravity of the liquid is approximately equal to a specific gravity of the substrate.

The apparatus can include a measuring device 150 configured to measure a shape of the top surface of the substrate while the substrate is held on the top surface of the liquid (with or without an intermediary membrane). Such shape measurement can include, for example, collecting relative z-height values across the working surface of the substrate to form a map of z-height deviations. Shape measurement can include mapping bow or curvature of a substrate either globally or locally. Various conventional metrology devices can be positioned above the container to measure the working surface of the substrate.

Another embodiment includes an apparatus for holding a substrate. This apparatus includes a container configured for holding a liquid. The container defines a top opening such that when the container is holding the liquid, a top surface of the liquid is accessible to substrate placement and substrate removal. A membrane is positioned in the container and configured to be in contact with the liquid when the container is holding liquid. A substrate handling mechanism is configured to place a substrate on the membrane and remove the substrate from the membrane. The membrane is sufficiently flexible to permit the substrate to at least partially sink into the liquid, and thus benefit from uniform fluid support of the entire backside surface of the substrate. The apparatus can include a substrate holding mechanism configured to prevent movement of the substrate when resting on the membrane and being supported by the liquid.

In alternative embodiments, liquid is selected for use that has a specific gravity of the liquid that is equal to or greater than a specific gravity of the substrate. The substrate holding mechanism can include a vacuum chuck configured to attach to a bottom surface of the substrate while the substrate rests on the liquid. In place of, or in addition to, the vacuum chuck, the substrate holding mechanism can include a perimeter support that contacts the substrate at a periphery of the substrate and that prevents lateral movement across the membrane while the substrate is resting on the membrane. The apparatus can include a measurement device configured to measure curvature of a front side surface of the substrate while the substrate is held on the membrane, and or measure other wafer characteristics such as z-height at coordinate locations on a surface of the substrate.

Other embodiments include a method for holding a substrate. In such a method, a first liquid is provided in a container. The container defines an opening sufficiently large to receive a substrate. A membrane is positioned in the container such that the membrane is in contact with a top surface of the first liquid. The substrate is positioned on the membrane in the container. The membrane is selected to be sufficiently flexible such that the substrate can at least partially sink into the first liquid. The substrate can be secured to prevent lateral movement of the substrate while the substrate is supported by the first liquid for surface measurements of the substrate.

The first liquid can be selected and/or modified to have a specific gravity of the first liquid that matches a specific gravity of the substrate, or that has a specific gravity equal to or greater than a specific gravity of the substrate. A second liquid can be added to the first liquid in the container. The second liquid increasing a viscosity of the first liquid. The substrate can be secured using a vacuum chuck that attaches to a bottom surface of the substrate, with the vacuum chuck contacting less than ten percent of a surface area of a bottom surface of the substrate. Securing the substrate can include using a perimeter support mechanism configured to prevent lateral movement of the substrate when supported by the first liquid. Methods can further include measuring curvature values of the substrate while supported on the first liquid, measuring z-height values of a top surface of the substrate at coordinate locations across the substrate while the substrate is supported on the first liquid, or measuring other characteristics of the substrate or devices thereon.

Another embodiment includes a method for holding a substrate. In this method, a first liquid is provided in a container. The container defines an opening sufficiently large to receive a substrate. The substrate is positioned on the first liquid in the container. The substrate is secured to prevent lateral movement of the substrate while the substrate is resting on the first liquid. Providing the first liquid in the container can include selecting the first liquid to have a specific gravity that matches a specific gravity of the substrate, or that is equal to or greater than a specific gravity of the substrate. A second liquid can be added to the first liquid in the container. The second liquid increasing a viscosity of the first liquid. Securing the substrate can include using a vacuum chuck that attaches to a bottom surface of the substrate, with the vacuum chuck contacting less than ten percent of a surface area of a bottom surface of the substrate. Securing the substrate can include using a perimeter support mechanism configured to prevent lateral movement of the substrate when supported by the first liquid. Methods can also include measuring surface characteristics of the substrate while supported on the first liquid.

Techniques herein also include a method for holding a substrate and a method for measuring a substrate. Such a method includes providing a first liquid in a container. The container defining an opening sufficiently large to receive a substrate. Positioning a membrane in the container such that the membrane is in contact with a top surface of the first liquid. Positioning the substrate on the membrane in the container. The membrane is selected to be sufficiently flexible such that the substrate is supported by the first liquid. Optionally the membrane is omitted and the substrate is placed directly on the liquid. The substrate is secured to prevent lateral movement of the substrate while the substrate is supported by the first liquid.

The first liquid in the container includes selecting the first liquid to have a specific gravity that matches a specific gravity of the substrate, or that is equal to or greater than a specific gravity of the substrate. A second liquid can be added to the first liquid in the container. The second liquid increases a viscosity of the first liquid. A vacuum chuck, other securing devices as described above, or other conventional securing devices can be used. The method can include executing various metrology operations such as measuring curvature values of the substrate while supported on the first liquid, measuring z-height values of a top surface of the substrate at coordinate locations across the substrate while the substrate is supported on the first liquid, or measuring other surface characteristics of the substrate while supported on the first liquid.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for holding a semiconductor wafer, the method comprising:
   providing a first liquid in a container, the container defining an opening sufficiently large to receive the semiconductor wafer;
   positioning a membrane in the container such that the membrane is in direct contact with a top surface of the first liquid;
   positioning the semiconductor wafer on the membrane in the container such that the semiconductor wafer is in direct contact with the membrane, the membrane being selected to be sufficiently flexible such that the semiconductor wafer can at least partially sink into the first liquid; and
   measuring a shape of a front side surface of the semiconductor wafer while the semiconductor wafer is positioned on the membrane, a backside surface of the semiconductor wafer being in contact with the membrane, the backside surface opposite the front side surface, measuring the shape of the first side surface including generating a map of z-height values across the front side surface of the semiconductor wafer.

2. The method of claim 1, wherein providing the first liquid in the container includes selecting the first liquid to have a specific gravity of the first liquid that matches a specific gravity of the semiconductor wafer.

3. The method of claim 1, wherein providing the first liquid in the container includes selecting the first liquid to have a specific gravity of the first liquid that is equal to or greater than a specific gravity of the semiconductor wafer.

4. The method of claim 1, further comprising adding a second liquid to the first liquid in the container, the second liquid increasing a viscosity of the first liquid.

5. The method of claim 1, wherein the membrane is selected that is sufficiently flexible to permit the top surface of the first liquid and the front side surface of the semiconductor wafer to be level with each other.

6. The method of claim 1, further comprising:
   securing the semiconductor wafer to prevent lateral movement of the semiconductor wafer while the semiconductor wafer is positioned on the membrane and supported by the first liquid.

7. The method of claim 6, wherein securing the semiconductor wafer to prevent lateral movement of the semiconductor wafer includes using a perimeter support that contacts the semiconductor wafer at a periphery of the semiconductor wafer and that prevents the lateral movement across the membrane while the semiconductor wafer is resting on the first liquid.

8. The method of claim 6, wherein securing the semiconductor wafer to prevent the lateral movement of the semiconductor wafer including using a vacuum chuck that attaches to the backside surface of the semiconductor wafer, the vacuum chuck contacting less than the percent of a surface area of the backside surface of the semiconductor wafer.

9. A method for holding a semiconductor wafer, the method comprising;
   providing a first liquid in a container, the container defining an opening sufficiently large to receive the semiconductor wafer;
   positioning a membrane in the container such that the membrane is in direct contact with a top surface of the first liquid;
   positioning the semiconductor wafer on the membrane in the container such that the semiconductor wafer is in direct contact with the membrane, the membrane being selected to be sufficiently flexible such that the semiconductor wafer can at least partially sink into the first liquid; and
   measuring a curvature of a front side surface of the semiconductor wafer while the semiconductor wafer is positioned on the membrane, a backside surface of the semiconductor wafer being in contact with the membrane, the backside surface opposite the front side surface, measuring the curvature of the front side surface including measuring relative z-height values at coordinate locations on the front side surface of the semiconductor wafer while the semiconductor wafer is supported by the first liquid.

10. The method of claim 9, wherein providing the first liquid in the container includes selecting the first liquid to have a specific gravity of the first liquid that matches a specific gravity of the semiconductor wafer.

11. The method of claim 9, wherein providing the first liquid in the container includes selecting the first liquid to have a specific gravity of the first liquid that is equal to or greater than a specific gravity of the semiconductor wafer.

12. The method of claim 9, further comprising adding a second liquid to the first liquid in the container, the second liquid increasing a viscosity of the first liquid.

13. The method of claim 9, wherein the membrane is selected that is sufficiently flexible to permit the top surface of the first liquid and the front side surface of the semiconductor wafer to be level with each other.

14. The method of claim 9, further comprising:
   securing the semiconductor wafer to prevent lateral movement of the semiconductor wafer while the semiconductor wafer is positioned on the membrane and supported by the first liquid.

* * * * *